June 6, 1967 H. T. FRISTOE 3,324,406

POWER CONSERVING BIASING SYSTEM FOR A CLASS B PUSH-PULL TRANSISTOR AMPLIFIER CIRCUIT

Filed May 20, 1964

INVENTOR.
HAROLD T. FRISTOE

BY

*Head & Johnson*

ATTORNEYS

United States Patent Office 3,324,406
Patented June 6, 1967

3,324,406

POWER CONSERVING BIASING SYSTEM FOR A CLASS B PUSH-PULL TRANSISTOR AMPLIFIER CIRCUIT

Harold T. Fristoe, Stillwater, Okla., assignor to Oklahoma State University of Agriculture and Applied Science, Stillwater, Okla., a corporation of Oklahoma Filed May 20, 1964, Ser. No. 368,768
2 Claims. (Cl. 330—15)

This invention relates to an improved class B push-pull transistor amplifier circuit. More particularly, the invention relates to an improved biasing arrangement for a class B push-pull transistor amplifier circuit, the most important characteristic of the improved biasing circuit being the power conserving feature.

The transistor has found exceedingly wide application in electronic circuits. One of the primary advantages of transistors which has resulted in their so immediate and wide spread application is that the transistor is inherently power conserving. That is, as compared to an electronic tube requiring a heated filament, the transistor requires no heated element and therefore is capable of operating electronic circuits on a minimum of power.

One problem, however, which has reduced the power conserving efficiency of transistor circuits, is the problem involved in establishing and maintaining the proper collector to emitter current, that is, proper biasing conditions. Proper biasing must be maintained in the transistor circuit despite variations in temperature, gain leakage current, and parameter variations of the transistors.

In some circuits the bias stabilizing power requirement may utilize as much power supply energy as does the output signal power with the amplifier operating at low average signal levels. This means that when a transistor radio or other transistorized electronic equipment is operating at low output signal power the energy drain on the battery or other power source for effectively biasing the output stage may equal or exceed the power consumption by the output stage.

It is therefore an object of this invention to provide an improved amplifying circuit wherein the power consumed by the circuit biasing arrangement is substantially less than other known circuit biasing means.

Another and more specific object of this invention is to provide a class B transistor push-pull amplifying circuit having biasing means of greately improved efficiency.

These and other objects will be fullfilled and a better understanding of the invention may be had by referring to the following description and claims taken in conjunction with the attached drawings, in which:

This invention may be described as an improved biasing arrangement for a class B push-pull transistor circuit. More particularly, but not by way of limitation, the invention may be described as an improved class B transistor amplifier circuit comprising an input transformer having a center tapped secondary, a first and a second amplifying transistor, the base of each of said amplifying transistors connected to opposite ends of the input transformer secondary, a center tapped primary output transformer, the collectors of each of said amplifying transistors connected to opposite ends of the primary of said output transformer, a voltage producing means impressing a voltage between said output transformer primary center tap and said amplifier transistor emitter circuits, a biasing transistor, and a voltage divider resistance in series with said biasing transistor across said voltage source, the voltage drop across said biasing transistor impressed between the emitter circuit of each of said amplifying transistors and the center tap of said transformers secondary.

Figure 1:
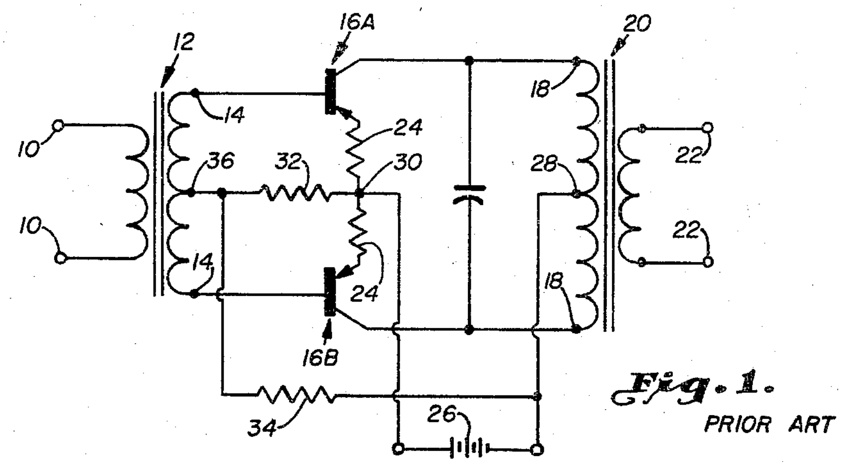
FIGURE 1 is a diagram of a typical push-pull class B transistor amplifier circuit utilizing a voltage divider biasing system as is most frequently presently employed.

Referring now to FIGURE 1 a typical class B push-pull transistor amplifying circuit as presently utilized is shown. The input signal to the circuit is impressed across the primary of an input transformer 12. The ends of the input transformers secondary 14 are each connected to a base of an amplifying transistor 16A and 16B. The collectors of each of the amplifying transistors 16A and 16B are connected to the ends of the primary 18 of an output transformer 20. The amplified output signal is taken across the secondary 22 of the output transformer 20.

A stabilizing resistor 24 is placed in the emitter circuit of each of the transistors 16A and 16B. A voltage source, such as a battery 26, applies a potential across the primary center tap 28, of the output transformer 20, and the juncture point 30 of the stabilizing resistors 24.

In this typical circuit of FIGURE 1 biasing is provided by a voltage divider arrangement. A biasing resistor 32 is placed in series with a voltage divider resistor 34 across the voltage 26. The voltage drop across the biasing resistor 32 is impressed between the juncture point 30 of the stabilizing resistor 24 and input transformer secondary center tap 36. In this way a small biasing voltage is continuously applied between the emitter and base circuits of amplifying transistors 16A and 16B.

The circuit of FIGURE 1 is frequently used in audio applications since it offers not only high output circuit efficiency under maximum signal conditions but also the power supply demand is relatively low during no signal or small signal conditions. Furthermore, low-duty cycle signals such as speech and music can be amplified with relatively high collector efficiencies, actually approaching in some cases the theoretical limit. True class B limitation tends to distort severly however, especially on low-level signals, due to cross-over effects. Consequently, it is customary if this cross-over effect is to be minimized to bias amplifying transistors 16A and 16B slightly into the class A region. In order to do this, if conventional transformer coupling at the input is to be utilized and if adequate biasing stabilization is to be achieved, considerable power is wasted in the input biasing circuit, that is, substantial power is consumed by the voltage divider network of the resistors 32 and 34.

The biasing power consumed contributes nothing towards the output energy taken across the output transformer secondary 22. Of course the energy loss by the biasing voltage divider circuit of resistors 32 and 34 can be decreased by increasing the impedance of these resistors but low impedance biasing networks must be used if it is desired to minimize signal losses at the input, and stabilize the operating point against temperature and transistor parameter variations.

In the circuit of FIGURE 1 the transistors 16A and 16B are of the PNP type such as number 2N1302, a type presently in typical usage for audio circuits; the stabilizing resistors 24 typically have a resistance of 8.2 ohms; the biasing resistor 32 has a resistance of 33 ohms; voltage divider resistor 34 has a typical resistance of 2,700 ohms; with the voltage 26 at 12 volts.

Figure 2:
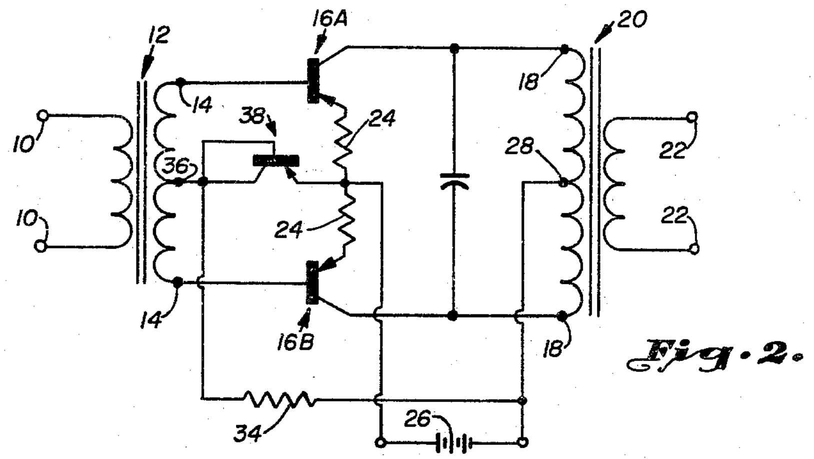
FIGURE 2 is a diagram of an improved class B push-pull transistor amplifier circuit wherein increased biasing efficiency is attained.

Referring now to FIGURE 2 an improved biasing arrangement is shown. The circuit of FIGURE 2 replaces the biasing resistor 32 as used in the circuit of FIGURE 1 with a biasing transistor 38. The biasing transistor 38 is shown to be of the PNP type and has the base connected to the collector. The biasing transistor 38 is in series with voltage divider resistor 34 across the power source 26 so that the voltage drop across the biasing transistor 38 provides the biasing for amplifying transistors 16A and 16B.

With the biasing transistors 38 having the base tied to the collector and with an emitter current in the neighborhood of approximately one milliamp, the dynamic resistance of the device is approximately 30 ohms. With the biasing transistor 38 substituted for biasing resistor 32, the circuit of FIGURE 2 responds to the input signals in essentially the same manner as does the circuit of FIGURE 1 yet the bleeder current is reduced to about ⅓ of its former valve. Therefore, the biasing power demand on the power supply is reduced to approximately ⅓ of that required in the circuit of FIGURE 1.

In the circuit of FIGURE 2, as an increasing signal is supplied to the primary of input transformer 12, the base circuits of amplifying transistors 16A and 16B will each draw current thus reducing the bias current flowing in biasing transistor 38. This reduces the collector and base currents of the biasing transistor 38 and therefore provides a corresponding decrease in voltage drop across the biasing transistor 38. Thus the dynamic resistance of the biasing transistor tends to increase beyond its initial no signal value. This results in a marked improvement in utilization of the power supply energy of the circuit and the total distortion of the circuit of FIGURE 2 still compares favorably with that of the reference circuit of FIGURE 1.

Figure 3:
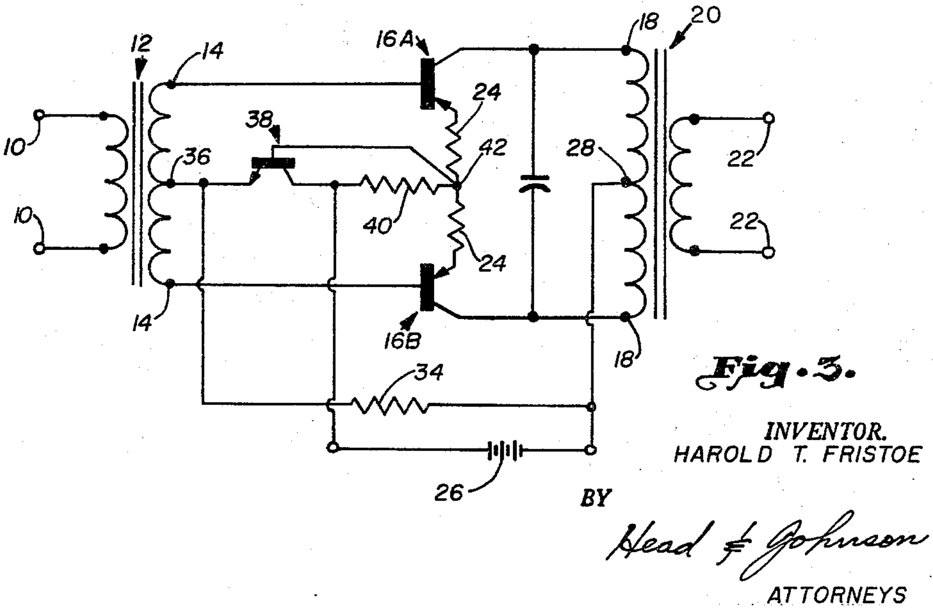
FIGURE 3 is a diagram of a class B push-pull transistor amplifier circuit disclosing the preferred embodiment of this invention wherein a biasing arrangement is provided achieving greatly improved power conservation.

Referring now to FIGURE 3 the preferred circuit arrangement of this invention is set forth. In the circuit of FIGURE 3 the biasing transistor 38 is an NPN type. In addition, a further difference between the circuit of FIGURE 3 and FIGURE 2 is the provision of a biasing resistor 40 placed in series with the emitter circuits of the amplifying transistors 16A and 16B across the voltage source 26. A circuit common point 42 is formed at the juncture of the stabilizing resistor 24 and the biasing resistor 40. The base of the biasing transistor 38 is tied to the common point 42 so that the voltage drop across the biasing resistor 40 applies a biasing voltage between the collector and the base of the biasing transistor 38.

In the circuit of FIGURE 3 the voltage drop across the biasing transistor 38 functions in the same way as previously described with reference to the circuit of FIGURE 2 the voltage drop across the biasing transistor 38 being applied between the transistors 16A and 16B.

An analysis of the circuit of FIGURE 3 discloses that when no signal is applied at the input of transformer 12 the amplifying transistors 16A and 16B can be biased so that they are operating at about collector current cut-off. This is obviously conservative of power supply energy, but unless the bias is sufficiently large, cross-over distortion will result with the application of an input signal. However, by arranging the circuit so that biasing transistor 38 is automatically biased by the amplifying transistors emitter circuit current under driving conditions, that is, by the voltage drop across biasing resistor 40, the no-signal power consumption can be kept extremely small, while the actual bias increases slightly as signal is applied. When circuit parameters are properly arranged there is established just sufficient bias for amplifying transistors 16A and 16B to minimize or completely eliminate cross-over distortion as the driving signal is varied from zero to its maximum value. At the same time, only the necessary power consumption from power source 26 for establishing the bias is demanded. When no signal is applied at the input, it will be seen that if biasing resistor 40 is extremely small, the base and collector of biasing transistor 38 are at essentially the same potential. This means that biasing transistor 38 is operating at the edge of the saturation region with the voltage across base-emitter approximately equal to the voltage across the collector-emitter. As signal is applied to input transformer 12, amplifying transistors 16A and 16B begin to draw emitter current in proportion to the signal amplitude. The emitter current causes a voltage increase across biasing resistor 40 which occurs essentially as half wave pulses for the conduction period of the amplifying transistors 16A and 16B. Consequently, the voltage across biasing resistor 40 is equivalent to the full wave rectified version of the input signal. This voltage appears in proper polarity to bias the biasing transistor 38 away from the saturation region so that it now maintains an emitter voltage which has become a function of the input signal. Therefore, as the signal rises, the bias for the amplifying transistors 16A and 16B tends to rise. With proper adjustment of the valve of biasing resistor 40 the biasing transistor 38 automatically developes a bias voltage of proper amplitude to always minimize cross-over distortion which would otherwise occur in the amplifying transistors 16A and 16B. This circuit arrangement results in considerable savings of power supply energy during low-duty cycle signals.

As a comparison between the conventional circuit of FIGURE 1 and the improved circuit of FIGURE 3, the circuit of FIGURE 1 requires a bleeder current of nearly 4.5 milliamperes for a continuous power drain of approximately 53 milliwatts regardless of input signal conditions. In the circuit of FIGURE 3, the minimum power demand for biasing during no-signal conditions is approximately 12 milliwatts. In the circuit of FIGURE 3 the biasing power consumed a function of the driving signal. Since most signals have a low-duty cycle, that is, voice or music signals, the average power required for adequate biasing to minimize distortion becomes a direct function of signal amplitudes and thus there is a considerable saving in total bias power consumed.

In addition to the saving in power consumption the advantages of low impedance in the biasing network is obtained in the circuit of FIGURE 3 since the biasing transistor 38 has a low dynamic impedance when operated in the region of near saturation. Furthermore, since symmetrical-type transistors are employed in the circuit, that is the circuit is adaptable to utilize PNP amplifying transistors 16A and 16B and an NPN type biasing transistor 38, temperature compensation is automatically maintained due to the fact that transistor parameter changes which occur with temperature tend to cancel each other.

The circuits of FIGURES 1, 2, and 3 all shown utilizing PNP type amplifying transistors. This is exemplary. Transistors 16A and 16B may be NPN type. When NPN type amplifying transistors are utilized the biasing transistor 38 of FIGURE 2 is changed to NPN type and the polarity of voltage source 26 is reversed. In FIGURE 3, when NPN amplifying transistors 16A and 16B are utilized the biasing transistor 38 is a PNP type and the polarity of voltage source 26 is changed.

Although this invention has been described with a certain degree of particularity it is manifested that many changes may be made in the details of construction and the arrangement of components without departing from the spirit and scope of this invention.

What is claimed:

1. An improved class B transistor amplifier circuit comprising:

an input transformer having a center tapped secondary;

a first and a second PNP amplifying transistor, each having a base, a collector and an emitter electrode, the base of each of said amplifying transistors being connected to opposite ends of the input transformer secondary;

a voltage source having a positive and a negative pole;

an output transformer having a center tapped primary, the collector electrode of each of said amplifier transistors being connected to opposite ends of the primary of said output transformer, the center tap of the primary of said output transformer being connected to said voltage source negative pole;

a stabilizing resistor in the emitter circuit of each of said amplifying transistors, said stabilizing resistors each being connected to a circuit common point;

an NPN biasing transistor having a base, a collector and an emitter electrode, having the emitter electrode thereof connected to the center tap of the secondary of said input transformer, having the base electrode thereof connected to said circuit common point, and having the collector electrode thereof connected to said voltage source positive pole;

a biasing resistor connecting said circuit common point to said voltage source positive pole; and a voltage divider resistor connected between said input transformer secondary center tap and said voltage source negative pole.

2. An improved energy conserving class B push-pull transistor amplifier circuit comprising:

an input transformer having a center tap secondary;

a first and a second amplifying transistor each having a base, a collector and an emitter electrode, the base electrode of each of said amplifying transistors being connected to opposite ends of said input transformer secondary, said amplifying transistors each being the same of one of a PNP and NPN type;

a voltage source;

an output transformer having a center tapped primary, the collector electrode of each of said amplifying transistors being connected to opposite ends of the primary of said output transformer;

stabilizing resistor in the emitter circuit of each of said amplifying transistors, each of said stabilizing resistors being connected to a circuit common point;

a biasing transistor having a base, a collector and an emitter electrode, said biasing transistor being one of a PNP and NPN type opposite said amplifying transistors, said biasing transistor having the emitter electrode connected to said center tap of said secondary of said input transformer, and having the base electrode thereof connected to said circuit common point;

a biasing resistor between said circuit common point and said biasing transistor collector electrode; and a voltage divider resistor between said input transformer secondary center tap and one pole of said voltage source, the center tap of said output transformer primary being connected to the same pole of said voltage source, the collector electrode of said biasing transistor being connected to the opposite pole of said voltage source.

References Cited

UNITED STATES PATENTS

| | | | |
|---|---|---|---|
| 2,812,393 | 11/1957 | Patrick | 330—15 |

FOREIGN PATENTS

| | | |
|---|---|---|
| 1,141,338 | 12/1962 | Germany. |
| 1,167,917 | 4/1964 | Germany. |
| 924,717 | 5/1963 | Great Britain. |
| 957,907 | 5/1964 | Great Britain. |

ROY LAKE, *Primary Examiner.*

F. D. PARIS, *Assistant Examiner.*